United States Patent [19]

Podeschwa et al.

[11] Patent Number: 4,821,595
[45] Date of Patent: Apr. 18, 1989

[54] POSITIONING DEVICE FOR THE PRODUCTION OF SEMICONDUCTOR COMPONENTS

[75] Inventors: Horst Podeschwa; Joachim Gérard; Wolfgang Schoepe, all of Dresden, German Democratic Rep.

[73] Assignee: VEB Elektromat Dresden, Dresden, German Democratic Rep.

[21] Appl. No.: 130,057

[22] Filed: Dec. 8, 1987

[30] Foreign Application Priority Data

Mar. 13, 1987 [DD] German Democratic Rep. ............................ 3007563

[51] Int. Cl.⁴ ............................................. G05G 11/00
[52] U.S. Cl. ........................................ 74/479; 269/73
[58] Field of Search .............. 74/479; 269/73; 33/1 M

[56] References Cited

U.S. PATENT DOCUMENTS

| 4,006,645 | 2/1977 | Newell | 74/479 |
| 4,234,175 | 11/1980 | Sato et al. | 269/73 |
| 4,409,860 | 10/1983 | Moriyama et al. | 74/479 |
| 4,492,356 | 1/1985 | Taniguchi et al. | 248/346 |
| 4,766,465 | 8/1988 | Takahashi | 355/53 |

FOREIGN PATENT DOCUMENTS 57-154846  9/1982  Japan ................................. 33/1 M

*Primary Examiner*—Dirk Wright
*Assistant Examiner*—Scott Anchell
*Attorney, Agent, or Firm*—Jordan and Hamburg

[57] ABSTRACT

The invention relates to a positioning device for the production of semiconductor components, particularly for wire bonding apparatuses, which positioning device is comprised of a cross table and separate x-direction and y-direction drive units.

According to the invention, the two drive units, each comprised of a drive motor with an excursion measuring system (1; 17) affixed to the frame via a support plate (2; 18) are disposed in a parallel orientation. Each support plate (2; 18) also bears a bearing (3; 19) for a drive spindle (5; 20). A drive nut (6; 22) is disposed on the drive spindle (5; 20), where the nut is nonrotatably fixed. A vertical bearing (8) is mounted on the support plate (2), which bearing bears two adjustable levers (9, 11) oriented at a mutual 90° angle, wherein the lever (9) is connected to the drive nut (6), and the lever (11) is connected to a x-direction guide a mechanism. A vertical bearing (24) attached to the support plate (18) bears a double lever (25), the main lever (26) of which is connected to the drive nut (22). The main lever (26) and the second lever (30) both bear rolling bearings which engage a guide rail (29) affixed to the cross table.

The invention enable increased operating speeds because of decreased moving mass. The positioning device is well adapted to production devices.

3 Claims, 3 Drawing Sheets

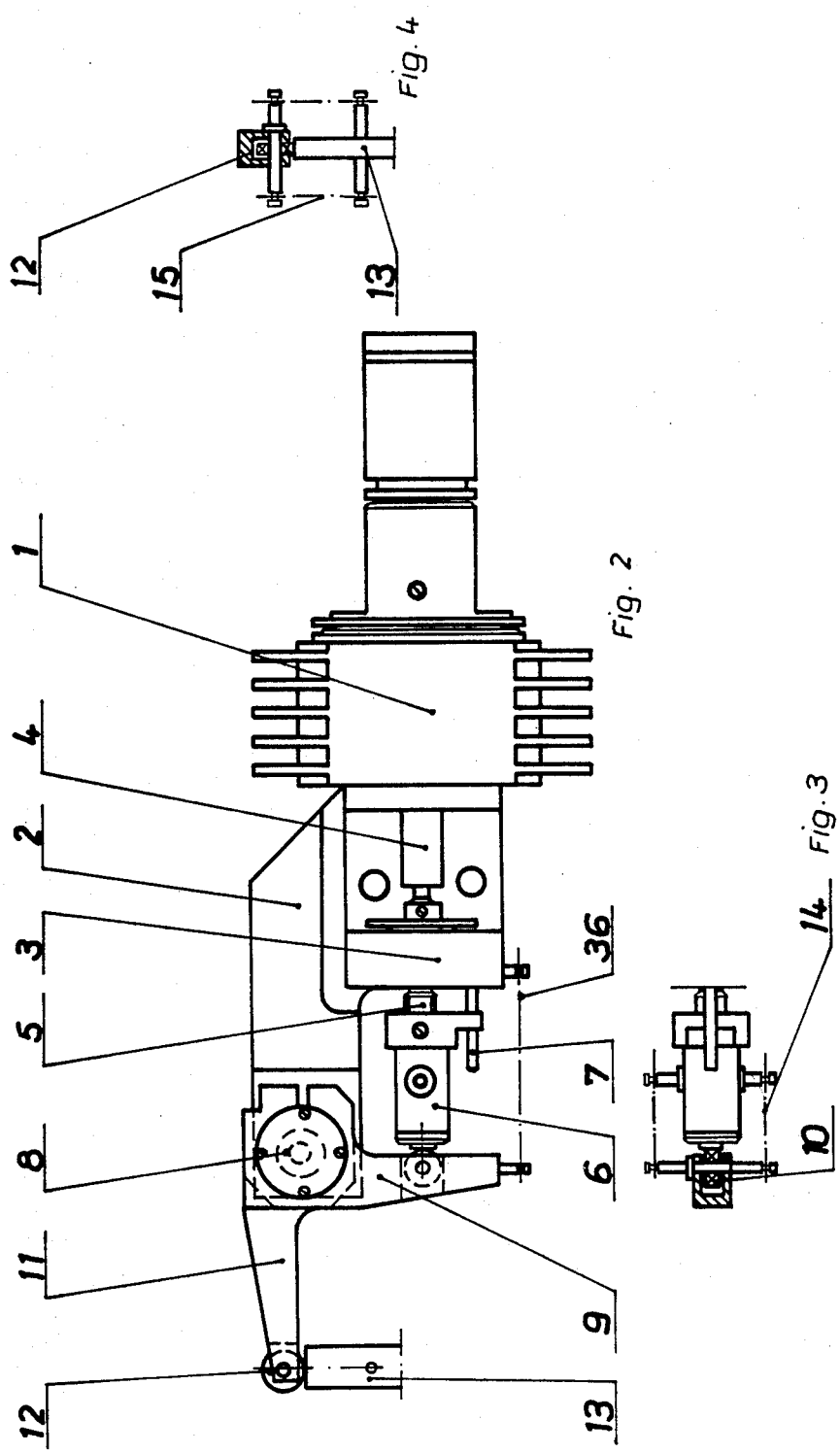

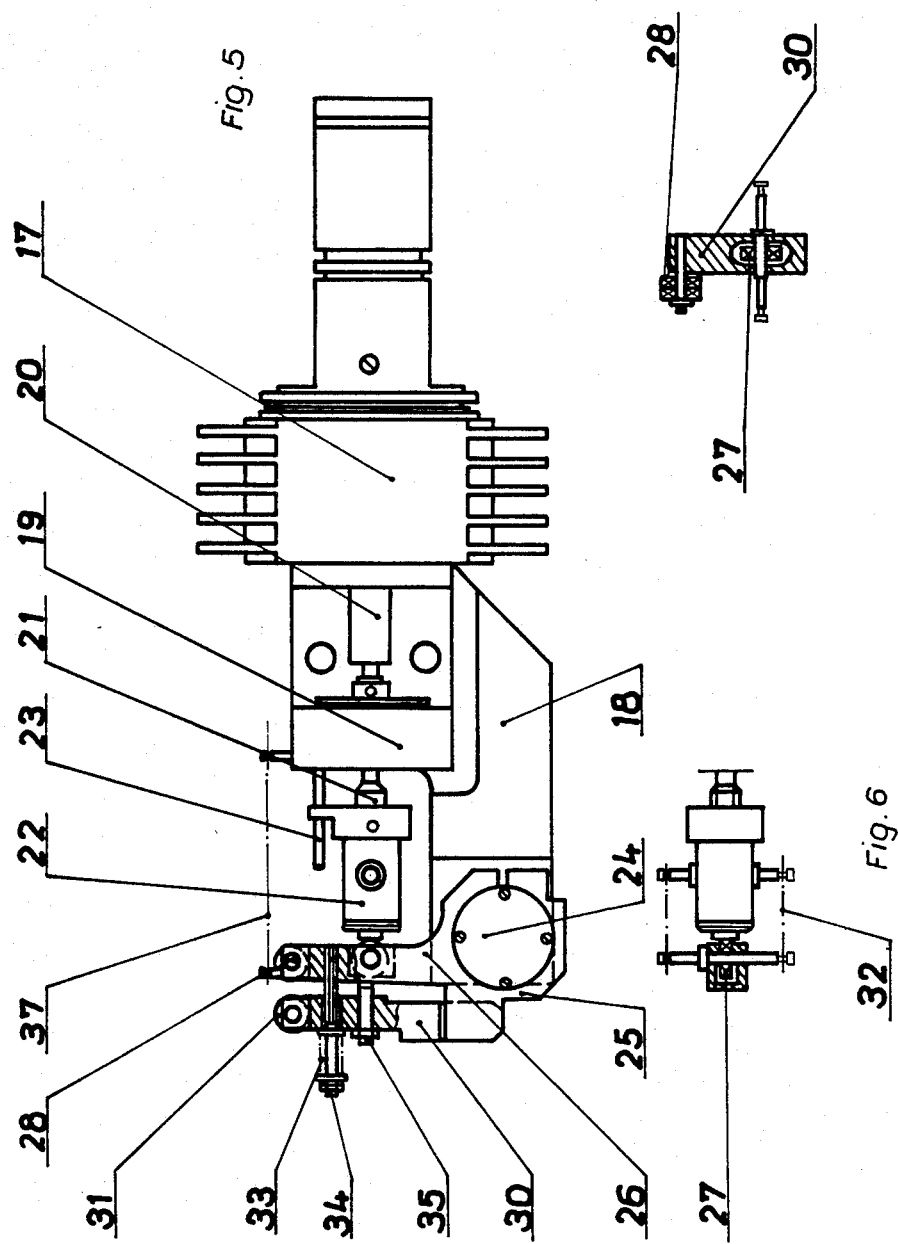

POSITIONING DEVICE FOR THE PRODUCTION OF SEMICONDUCTOR COMPONENTS

BACKGROUND OF THE INVENTION

The invention relates to a positioning device for the production of semiconductor components, particularly for wire bonding apparatuses, wherein the semiconductor components are positioned by a cross table movable in the x- and y-directions.

Various positioning devices are known, e.g. those of the firms Delvotec, S.A., of Munich, Laser Optronic, of Munich, and Schneeberger AG, of Switzerland, which devices comprise a cross table with separate x-direction and y-direction drives, with the driving and guiding axes being separated by 90°. One of the drive spindles is mounted in a fixed position on the machine frame, whereas the second drive device is carried along with the cross table. With these technical solutions, there is inevitably a large moving mass, which imposes limitations on the speed of operation. Also, the 90° between the two driving-and-guiding shafts creates a large space requirement.

SUMMARY OF THE INVENTION

The object of the invention is to provide a positioning device for the production of semiconductor components which meets the accuracy requirements for wire bonding, enables optimum operating speeds, and can be compactly built.

ESSENCE OF THE INVENTION

The underlying problem of the invention is to devise a positioning device for the production of semiconductor components, in which device moving-masses are small, and which device can be readily fitted into apparatuses for manufacturing semiconductor components.

The point of departure for the solution of this problem is a positioning device which has a cross table and separate x-direction and y-direction drives.

The said problem is solved according to the invention in that the two drive units, each comprised of a drive motor with excursion measuring system, are disposed in a parallel orientation. The x-direction drive motor with the x-direction excursion measuring system is affixed to the machine frame, on one side of a support plate which also bears the bearing for the drive spindle. A drive nut is disposed on the drive spindle. The nut is irrotationally fixed by a guide rod, wherewith when the drive spindle is rotated the drive nut executes a longitudinal movement. A vertical bearing is disposed on the support plate, which bearing bears an adjustable lever in which a rolling body is disposed. This rolling body is disposed so as to engage the end face of the drive nut. The vertical bearing also bears a second adjustable lever with a rolling bearing disposed on the end of said second lever. The second adjustable lever is oriented at a 90° angle to the first lever. It interacts via its rolling bearing with a connecting piece on the cross table. The drive nut and the lever interacting with it are force-lockingly interconnected by means of two springs. Likewise, the connecting piece of the cross table and the second lever, which interacts with it, are force-lockingly interconnected by means of two springs.

The y-direction drive unit, comprised of the y-direction drive motor with excursion measuring system, is also affixed to the machine frame on a support plate, which plate also bears the bearing for the drive spindle. A drive nut is disposed on the drive spindle and is nonrotatably fixed by a guide rod. A vertical bearing attached to the support plate bears a double lever, the main lever of which bears a rolling body which interacts with the end face of the drive nut. A pair of rolling bearings is disposed on the end of the main lever. This pair of rolling bearings engages a guide rail attached to the cross table and running parallel to the x-coordinate. The main lever and the drive nut are force-lockingly interconnected by means of two springs. A second lever is pivotably mounted on the main lever, and bears a roller body on its end which roller body also engages said guide rail. This second lever is force-lockingly connected to the main lever via a stressing (compression) spring, a tensioning bolt, and an adjusting bolt.

When the x-direction drive is moved, the longitudinal movement of the drive nut is converted, by the angle lever drive, into movement transverse to the drive spindle axis, and this movement is transmitted to the x-direction guide means of the cross table, wherein the mechanical ratio of the two levers is adjusted for optimal traveling conditions for the cross table.

The guide rail which acts as a transmission member for the y-direction drive is exactly parallel to the x-direction guide means of the cross table, so that when driving occurs in the x-direction, the rail slides in its position between the pair of y-direction levers.

When the y-direction drive unit is operated, the longitudinal movement of the drive nut is transmitted directly by the double lever, with the same mechanical ratio as for the x-direction drive unit, which ratio is adjusted for optimal traveling conditions for the cross table.

BRIEF DESCRIPTION OF THE DRAWING

The invention will be described with the aid of the following exemplary embodiments and the accompanying drawings.

FIG. 2 is a plan view of the x-direction drive unit;

FIG. 3 is a view of the tension in means for holding together the drive nut and lever;

FIG. 4 is a view of the tensioning means for holding together the connecting piece providing a connection to the cross table, and the lever;

FIG. 5 is a plan view of the y-direction drive unit;

FIG. 6 is a view of the tensioning means for holding together the drive nut and the double lever; and FIG. 7 is a view of the lever with the pair of rolling bearings.

DETAILED DESCRIPTION OF THE PREFERRED EMBODIMENT

Figure 1:
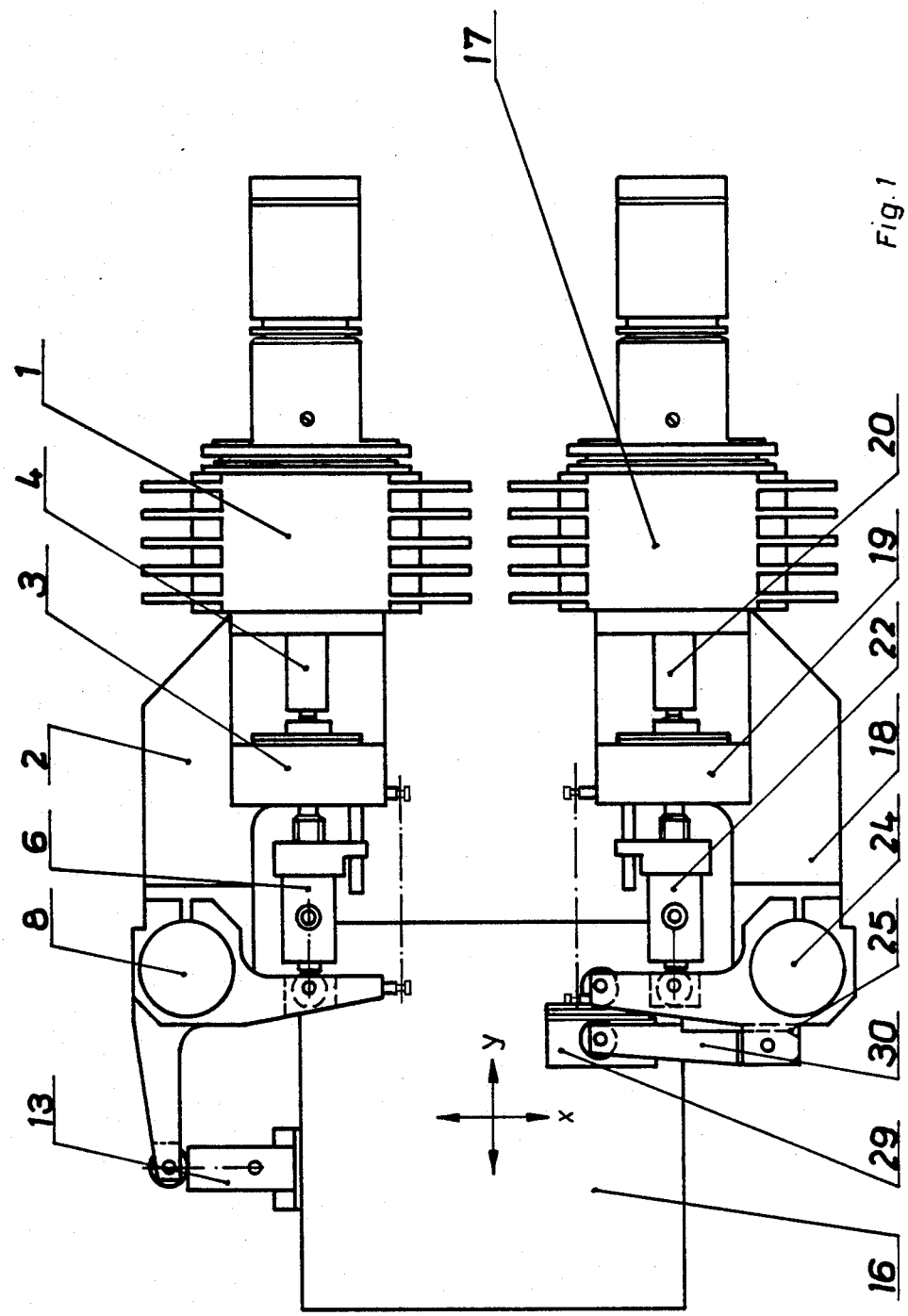
FIG. 1 is an overall plan view of the positioning device.

The positioning device is comprised of a cross table, an x-direction drive unit, and a y-direction drive unit.

The x-direction drive unit is comprised of the x-direction drive motor 1 with an excursion measuring system, which motor is flange-mounted on a support plate 2, and a bearing 3 which accommodates a drive spindle 5 upon which a drive nut 6 is nonrotatably mounted with the aid of a guide rod 7. The x-direction drive motor is coupled to the drive spindle 5 by a corrugated tube coupling 4.

A vertical bearing 8 on the support plate 2, which bearing 8 may be in the form of a cylindrical bushing, accommodates an adjustable lever 9 and rolling bearing 10, along with a second adjustable lever 11 and rolling bearing 12, with levers 9 and 11 being disposed at a mutual 90° angle. Lever 9 and drive nut 6 are acted on by two springs 14, and lever 11 and connecting piece 13 for the x-direction are acted on by two springs 15, such that springs 14 and 15 provide respective force-locking connections.

When the x-direction drive is moved, the longitudinal movement of the drive nut 6 is converted, by the angle lever drive with arms 9 and 11 which are 90+ apart, into movement transverse to the drive spindle axis, and this movement is transmitted to the x-direction guide means of the cross table 16, wherein the mechanical ratio of the levers 9 and 11 is adjusted for optimal traveling conditions for the cross table.

The y-direction drive unit is comprised of a y-direction drive motor 17 with an excursion measuring system, which is flange-mounted on a support plate 18, and a bearing 19 which accommodates a drive spindle 21 upon which a drive nut 22 is nonrotatably mounted with the aid of guide rod 23. The y-direction drive motor is coupled to the drive spindle 21 by a corrugated tube coupling 20.

A vertical bearing 24, which may be in the form of a cylindrical bushing, accommodates an adjustable double lever 25 of which the main lever 26 is furnished with a rolling bearing 27. The main lever 26 and drive nut 22 are mutually acted on by two springs 32, and a second pair of rolling bearings 28 is provided at the end of lever 26.

A second lever 30 of the double lever 25 is pivotably mounted on the main lever 26, includes a rolling bearing 31, and is forcibly held in place by spring-loaded connections to the main lever 26, a tensioning bolt 34, and a tensioning spring 33. Rolling bearing pair 28 and rolling bearing 31 communicate mechanically with a guide rail 29 affixed to the cross table 16. The distance between bearing pair 28 and bearing 31 is adjusted by an adjusting bolt 35.

The guide rail 29 is precisely parallel to the x-direction guide means of the cross table. The mechanical ratio is determined by the distance from the bearing 24 to the spindle axis, and the distance from the bearing 24 to the rolling bearing pair 28. This ratio is adjusted for optimal traveling conditions for the cross table.

Springs 36 and 37 provide additional tensile holding of the lever system to the support plate, and eliminate any play between the drive spindle and drive nut.

We claim:

1. A positioning device for the production of semiconductor components, comprising:
   (a) a cross table including a guide rail;
   (b) a first support plate;
   (c) an x-direction drive unit flange-mounted on one side of said first support plate, said x-direction drive unit including:
      (i) a first drive motor;
      (ii) a first drive spindle;
      (iii) first bearing means mounted on the first support plate for carrying said first drive spindle;
      (iv) a first drive nut positioned on the first drive spindle;
      (v) first guide rod means for preventing rotation of sid first drive nut;
      (vi) a first adjustable lever;
      (vii) first rolling bearing means positioned on said first adjustable lever for engaging an end face of said first drive nut;
      (viii) a second adjustable lever oriented approximately 90° to said first adjustable lever;
      (ix) x-direction guide means including a connecting piece;
      (x) second rolling bearing means positioned on an end of said second adjustable lever for interaction with said connecting piece;
      (xi) first vertical bearing means mounted on the first support plate for holding said first and second adjustable levers;
      (xii) first spring means for force-lockingly interconnecting said first drive nut and said first adjustable lever;
      (xiii) second spring means for force-lockingly interconnecting the connecting piece of the x-direction guide means and the second adjustable lever;
   (d) a second support plate;
   (e) a y-direction drive unit flange-mounted on one side of said second support plate and and separate from said x-direction drive unit, said y-direction drive unit being disposed in a parallel orientation with respect to said x-direction drive unit, said y-direction drive unit including:
      (i) a second drive motor;
      (ii) a second drive spindle;
      (iii) second bearing means mounted on the second support plate for carrying said second drive spindle;
      (iv) a second drive nut positioned on the second drive spindle;
      (v) second guide rod means for preventing rotation of said second drive nut;
      (vi) a double lever including a main lever and a secondary lever which is pivotally mounted on the main lever;
      (vii) second vertical bearing means mounted on the second support plate for holding said double lever;
      (viii) third rolling bearing means positioned on said main lever for engaging an end face of said second drive nut;
      (ix) a pair of rolling bearing means positioned on an end of the main lever for engaging the guide rail on the cross table and extending substantially parallel to the x-direction of the cross table;
      (x) third spring means for force-lockingly interconnecting said second drive nut and said main lever;
      (xi) a tensioning bolt;
      (xii) an adjusting bolt;
      (xiii) fourth spring means for force-lockingly interconnecting the secondary lever of the double lever and the main lever of the double lever, with the aid of said tensioning bolt and adjusting bolt; and
      (xiv) fourth rolling bearing means on an end of said secondary lever of said double lever for engaging the guide rail on the cross table.

2. A positioning device for the production of semiconductor components, comprising:
   (a) a cross table including a guide rail;
   (b) support means;
   (c) an x-direction drive unit mounted on said support means, said x-direction drive unit including:
      (i) a first drive motor having a drive spindle;
      (ii) first bearing means mounted on the support means for carrying said first drive spindle;

(iii) a first drive nut positioned on the first drive spindle;
(iv) a first adjustable lever;
(v) first rolling bearing means positioned on said first adjustable lever for engaging an end face of said first drive nut;
(vi) a second adjustable lever oriented approximately 90° to said first adjustable lever;
(vii) x-direction guide means including a connecting piece;
(viii) second rolling bearing means positioned on an end of said second adjustable lever for interaction with said connecting piece;
(ix) first vertical bearing means mounted on the support means for holding said first and second adjustable levers;
(x) first spring means for connecting said first drive nut and said first adjustable lever;
(xi) second spring means for connecting the connecting piece of the x-direction guide means and the second adjustable lever;
(d) a y-direction drive unit mounted on said second support plate and and separate from said x-direction drive unit, said y-direction drive unit being disposed in a parallel orientation with respect to said x-direction drive unit, said y-direction drive unit including:
(i) a second drive motor having a second drive spindle;
(ii) second bearing means mounted on the second support plate for carrying said second drive spindle;
(iii) a second drive nut positioned on the second drive spindle;
(iv) a double lever including a main lever and a secondary lever which is pivotally mounted on the main lever;
(v) second vertical bearing means mounted on the support means for holding said double lever;
(vi) third rolling bearing means positioned on said main lever for engaging an end face of said second drive nut;
(vii) a pair of rolling bearing means positioned on an end of the main lever for engaging the guide rail on the cross table and extending substantially parallel to the x-direction of the cross table;
(viii) third spring means for connecting said second drive nut and said main lever;
(ix) fourth spring means for connecting the secondary lever of the double lever and the main lever of the double lever;
(x) fourth rolling bearing means on an end of said second lever of said double lever for engaging the guide rail on the cross table.

3. A positioning device according to claim 2; further including first guide rod means for preventing rotation of said first drive nut and second guide rod means for preventing rotation of said second drive nut.

* * * * *